United States Patent [19]

Hase et al.

[11] Patent Number: 5,609,993
[45] Date of Patent: Mar. 11, 1997

[54] PROCESS FOR PRODUCING LITHOGRAPHIC PRINTING PLATE, PHOTOSENSITIVE PLATE AND AQUEOUS INK COMPOSITION THEREFOR

[75] Inventors: Takakazu Hase, Nishinomiya; Seiji Arimatsu; Koichi Kimoto, both of Hirakata, all of Japan

[73] Assignee: Nippon Paint Co., Ltd., Osaka-fu, Japan

[21] Appl. No.: 318,559

[22] Filed: Oct. 5, 1994

Related U.S. Application Data

[63] Continuation-in-part of Ser. No. 870,423, Apr. 17, 1992, abandoned.

[30] Foreign Application Priority Data

Apr. 17, 1991 [JP] Japan .................................. 3-085176

[51] Int. Cl.⁶ .......................................................... G03F 7/30
[52] U.S. Cl. ........................... 430/302; 430/300; 430/961; 430/273.1; 101/463.1; 101/467; 101/465
[58] Field of Search ................................... 430/302, 300, 430/961, 273, 273.1; 101/463.1, 467, 465; 346/140 R

[56] References Cited

U.S. PATENT DOCUMENTS

| | | | |
|---|---|---|---|
| 4,072,527 | 2/1978 | Fan | 430/273 |
| 4,345,056 | 8/1982 | Thyret et al. | 526/200 |
| 4,512,807 | 4/1985 | Ogawa et al. | 106/22 |
| 4,528,315 | 7/1985 | Eck et al. | 524/458 |
| 4,555,437 | 11/1985 | Tanck | 428/212 |
| 4,981,765 | 1/1991 | Mizuguchi | 430/5 |

FOREIGN PATENT DOCUMENTS

| | | |
|---|---|---|
| 0290916 | 11/1988 | European Pat. Off. |
| 0303572 | 2/1989 | European Pat. Off. |
| 3417582 | 11/1984 | Germany |
| 61-117549 | 6/1986 | Japan ............ 430/302 |
| 2286335 | 11/1990 | Japan |
| 1575200 | 9/1980 | United Kingdom ............ 101/467 |
| 2235545 | 6/1991 | United Kingdom |
| 90/09622 | 8/1990 | WIPO ............ 430/302 |

OTHER PUBLICATIONS

English Translation (PTO-93-3158) of Japanese Patent Application 2-286335 (Pub. Nov. 26, 1990).
C. A. Finch, ed, *Polyvinyl Alcohol Properties and Applications*, pp. 17-19 (no further information given).
"The Chemistry of Scripset Resins", Table II, two pages. (no further information given).
F. Lennart Marten, "Vinyl Alcohol Polymers", vol. 17, *Encyclopedia of Polymer Science and Engineering*, John Wiley & Sons, New York, NY, 1989, pp. 167-198.
Mark S. M. Alger, "Acid Value", *Polymer Science Dictionary*, Elsevier Science Publishers LTD, Essex, England, 1989, p. 4.
English translation of Japanese 61-117549 already cited.
Gessner Hawley, "Saponification Number", *The Condensed Chemical Dictionary*, 9th ed, Van Nostrand Reinhold Company, p. 764 (no date).
World Patents Index Latest Week 9102, Derwent Publications Ltd., London, GB; AN 91-012325 & JP-A-2 286 335 (Matsushita) 26 Nov. 1990 *abstract*.
World Patents Index Latest Week 8507, Derwent Publications Ltd., London, GB; AN 85-041543 & JP-A-60 000 995 (Mitsubishi) 7 Jan. 1985 *abstract*.
World Patents Index Latest Week 9021, Derwent Publications Ltd., London, GB; AN 90-160767 & JP-A-2 103 274 (Dainichiseika Color Chem) *abstract* Apr. 16, 1990.

*Primary Examiner*—Cynthia Hamilton
*Attorney, Agent, or Firm*—Wenderoth, Lind & Ponack

[57] ABSTRACT

The present invention provides an improvement of the direct lithographic printing plate making process using ink-jet printing, which provides a printing plate having excellent resolution. Accordingly, the present invention provides an improvement of a process for producing a lithographic printing plate comprising selectively forming a light transmittable oxygen barrier film on a photopolymerizable layer of a photosensitive plate, exposing to light and then removing uncured portion on which the oxygen barrier film is not covered, wherein a protective layer which is capable of transmitting oxygen gas and the light to cure the photopolymerizable layer is formed on the photopolymerizable layer, a photosensitive plate therefor and an aqueous ink composition therefor.

8 Claims, No Drawings ns 5,609,993

PROCESS FOR PRODUCING LITHOGRAPHIC PRINTING PLATE, PHOTOSENSITIVE PLATE AND AQUEOUS INK COMPOSITION THEREFOR

This application is a continuation-in-part of now abandoned U.S. application Ser. No. 07/870,423, filed Apr. 17, 1992.

FIELD OF THE INVENTION

The present invention relates to an improvement of a process for directly producing a lithographic printing plate by ink-jet printing based on informations stored in a computer or a facsimile machine without a positive or negative film, and an aqueous ink composition therefor as well as a photosensitive plate therefor.

BACKGROUND OF THE INVENTION

In a process for producing a lithographic printing plate, there has been desired a direct plate making process in which an image is directly formed based on digital informations stored in a computer, a facsimile machine and the like, without a positive or negative film. As one of the direct plate making processes, it has been proposed to form an image by ink-jet printing. The ink-jet printing can output the information relatively high speed and is also a simple system in comparison with the other systems which need a complicated optical system. The simple system reduces maintenance fee, thus making cost reduction down of the plate making process.

Japanese Kokai Publication 2-286335 proposes a direct plate making process using the ink-jet printing. In this process, an image is formed by the ink-jet printing on a photosensitive plate which comprises a substrate and a photopolymerizable layer formed thereon. The image is capable of transmitting light to cure the photopolymerizable layer and made from an oxygen barrier resin material. Accordingly, when the photosensitive plate having the image is exposed to light to cure, oxygen inhibits polymerization reaction at the portion without the oxygen barrier film, but the portion with the oxygen barrier film permits the polymerization reaction to cure. The uncured portion is removed by development to create a lithographic printing plate.

The ink which is used for ink-jet printing is generally aqueous, but the surface of the photopolymerizable layer on which the ink is printed is hydrophobic. Accordingly, when the image is printed by ink-jet printing, some problems such as repelling or spreading of ink occur and do not provide a lithographic printing plate having good resolution. The surface of the photopolymerizable layer is generally tacky and therefore is difficult to handle. Further, the polymerizable monomers contained in the photopolymerizable layer volatilize a little and therefore reduce photosensitivity and curing degree, thus lowering printing durability.

Also, the surface energy of the photopolymerizable layer varies on the type of compositions and therefore the degree of repelling or spreading of ink varies according thereto. Thus, the resolution of the obtained printing plate also varies.

SUMMARY OF THE INVENTION

The present invention provides an improvement of the direct lithographic printing plate making process using ink-jet printing, which provides a printing plate having excellent resolution. Accordingly, the present invention provides an improvement of a process for producing a lithographic printing plate comprising selectively forming a light transmittable oxygen barrier film on a photopolymerizable layer of a photosensitive plate, exposing to light and then removing uncured portion on which the oxygen barrier film is not covered, wherein a protective layer which is capable of transmitting oxygen gas and the light to cure the photopolymerizable layer is formed on the photopolymerizable layer.

The present invention also provides a photosensitive plate for a process for producing a lithographic printing plate comprising selectively forming a light transmittable oxygen barrier film on a photopolymerizable layer of a photosensitive plate, exposing it to light and then removing the uncured portion on which the oxygen barrier film is not covered, which comprises:

a substrate, the photopolymerizable layer formed on the substrate, and a protective layer which is capable of transmitting oxygen gas and the light to cure the photopolymerizable layer.

The present invention further provides an aqueous ink composition for a process for producing a lithographic printing plate comprising selectively forming a light transmittable oxygen barrier film on a photopolymerizable layer of a photosensitive plate, exposing to light and then removing uncured portion on which the oxygen barrier film is not covered, which comprises:

(a) 0.2 to 15% by weight of a water soluble or water dispersible polymer which is capable of transmitting the light to cure the photopolymerizable layer, (b) 0.5 to 40% by weight of a polyhydric alcohol, and (c) 0.1 to 5% by weight of a surfactant.

DETAILED DESCRIPTION OF THE INVENTION

First of all, the photosensitive plate will be explained.

The photosensitive plate generally comprises a substrate and a photopolymerizable layer formed thereon. It is important in the present invention that the protective layer which is capable of transmitting oxygen gas and the light to cure the photopolymerizable layer is formed on the photopolymerizable layer.

The substrate may be formed from metal, plastics, paper and a composite thereof, but metal (e.g. aluminum, magnesium, zinc, chromium, iron, nickel and an alloy thereof) is preferred in view of dimension stability and durability. Aluminum is more preferred in view of its hydrophilic properties. The substrate preferably is subjected to a pretreatment, such as a mechanical treatment (e.g. ball polishing and brush polishing), a chemical treatment (e.g. acid treatment) and an electrochemical treatment (e.g. electrolysis etching). The pretreated substrate, if possible, may be further treated with anodizing process or sodium silicates.

The photopolymerizable layer of the present invention is formed from a composition which comprises a polymerizable compound having at least one ethylenically unsaturated group, a photopolymerization initiator and a sensitizer, which may contain a linear organic polymer, a polymerization inhibitor, a coloring agent, a plasticizer and the like. Detailed components, preparation methods and composition ratios are well known (see U.S. Pat. Nos. 2,760,863, 2,791,504 and 3,801,328).

The polymerizable compound having at least one ethylenically unsaturated group is a material which undergoes addition polymerization by the intiation of the polymerization initiator to cure, including an unsaturated carboxylic acid, such as (meth)acrylic acid, itaconic acid and maleic acid; an unsaturated carboxylic ester, such as methyl (meth- )acrylate, ethyl (meth)acrylate; and an ester of polyhydric acid (e.g. ethylene glycol, tetraethylene glycol, neopentyl glycol, propylene glycol, 1,2-butanediol, trimethylolpropane, pentaerythritol, dipentaerythritol) with the above mentioned unsaturated carboxylic acid; a reaction product of an epoxide (e.g. trimethylolpropane polyglycidyl ether, pentaerythritol polyglycidyl ether, propyleneglycol diglycidyl ether, a reaction product of epichiorohydrin and 2,2-bis(4-hydroxyphenyl)-propane)with the above mentioned unsaturated carboxylic acid; and the like. Preferred are (meth)acrylic esters.

The photopolymerization initiator is one which produces radical groups upon absorbing light, including benzophenones, such as benzophenone, methyl o-benzoylbenzoate, N,N'-tetraethyl-4,4'-diaminobenzophenone, Michler's ketone and thioMichler's ketone; acetophenones, such as 2,2-dimethoxyacetophenone, 2,2-diethoxyacetophenone, 2,2-dimethoxy-2-phenylacetophenone, alpha-hydroxycyclohexylphenyl ketone, 2-hydroxy-2-methyl-1-phenylpropanone-1 and 2-methyl-1-[4-(methylthio)phenyl]-2-morpholinopropanone-1; benzoins and their alkyl ethers, such as benzoin, benzoin methyl ether, benzoin propyl ether and benzoin isobutyl ether; benzoic esters, such as ethyl p-dimethylamino benzoate and ethyl p-dietylaminobenzoate; thioxanthones, such as thioxanthone, 2-ethylthioxanthone, 2,4-diethylthioxanthone and 2-chlorothioxanthone; ethylanthraquinone; 9-phenylacridine; 9-p-methoxyphenyl acridine; 9,10-dimethylbenzphenazine; 6,4',4"-trimethoxy-2,3-diphenyl quinoxaline; peroxides, such as benzoylperoxide, di-t-butylperoxide, dicumylperoxide and cumene hydroperoxide; nitrofluorene; 2,4,6-triphenylpyryliumtetrafluoroborate; 2,4,6-tris(trichloromethyl)-1,3,5-triazine; N-aryl-alpha-amino acid, such as N-phenylglycine and N-(p-chlorophenylglycine; aryliodonium salts, such as diphenyliodonium salt and bis(p-chlorophenyl)iodonium salt; and the like. Heterocyclic aromatic hydrocarbons (e.g. anthracene, phenanthrene and perylene) and dyes (e.g., 3,3-carbonylbiscoumarin, Rose bengal, Eosin, xanthene, thioxanethene, cyanine and merocyanine) can also be used. Since the photopolymerizable composition is exposed to light to cure after an image pattern is formed thereon, it is preferred that the composition is sensitive to visible light. Examples of such compositions are those described in Japanese Kokai Publications 57-114139, 59-142205 and 63-180946 which is corresponding to U.S. Pat. No. 4,868,092.

The linear organic polymer is an optional component, and preferably has alkaline solubility and alkaline swelling ability when the developer is alkaline. Examples of the polymers are a copolymer of (meth)acrylic acid and another alkyl (meth)acrylate or (meth)acrylonitrile; a copolymer of itaconic acid and alkyl (meth)acrylate or (meth)acrylonitrile; a copolymer of crotonic acid and alkyl (meth)acrylate or (meth)acryionitrile; a copolymer of vinyl acetate and alkyl (meth)acrylate; a copolymer of a partially alkylated maleic acid and alkyl (meth)acrylate or (meth)acrylonitrile; a copolymer of maleic anhydride and styrene or its derivative, an unsaturated hydrocarbon, an unsaturated ether or an unsaturated ester; an esterified product of a copolymer of maleic anhydride; an esterified product of a copolymer having hydroxyl groups and a di- or poly-carboxylic anhydride; a copolymer of hydroxyalkyl (meth)acrylate and an alkyl (meth)acrylate or a (meth)acrylonitrile; a copolymer of an allyl alcohol and susbtituted or non-substituted styrene; a copolymer of vinyl alcohol and an alkyl (meth)acrylate or a copolymerizable monomer; an acidic cellulose having carboxylic groups; a polyurethane having free hydroxyl groups; an epoxy resin; a polyester having free hydroxyl groups; a partially saponified vinyl acetate copolymer; a polyvinyl acetal having free hydroxyl groups; a copolymer of hydroxy styrene and a alkyl (meth)acrylate; phenol formaldehyde resin; a polyether or polyamide prepared from 2,2-bis-(4-hydroxyphenyl)propane or polyethylene oxide, polyvinylpyrrolidone or epichlorohydrin; and the The photopolymerizable layer of the present invention has a thickness sufficient for lithographic printing, but preferably is within the range of 0.1 to 10 g/m$^2$, preferably within the range of 1 to 5 g/m$^2$. Thickness of less than 0.1 g/m$^2$ reduces printing durability of the plate. If it is more than 10 g/m$^2$, polymerization inhibition by oxygen is poor and curing may occur at the portion which has to be dissolved away, thus providing scumming in printing.

The protective layer which is formed on the photopolymerizable layer is capable of transmitting oxygen gas and the light to cure the photopolymerizable layer. It is important that the protective layer transmits oxygen gas, which ensures the polymerization inhibition. If the protective layer has poor oxygen permeability, the polymerization reaction occurs even when the photosensitive plate is stored and resolution becomes poor, it is preferred that the protective layer has an oxygen permeability coefficient of $1\times10^{-13}$ or more, preferably $1\times10^{-14}$ or more at room temperature.

According to the present invention, the ink is not ink-jet printed on the photopolymerizable layer but printed on the protective layer which can easily control surface energy in relation to the ink and therefore reduces repelling or spreading of ink, thus enhancing resolution of the printing plate. The surface energy of the protective layer can vary depending on the surface energy of the aqueous ink composition, but is preferably adjusted within the range of 30 to 60 dyn/cm, more preferably 35 to 55 dyn/cm. If the surface energy is less than 30 dyn/cm, the printed image is spreading even if a surfactant is added to the ink composition to control the surface energy. If it is more than 60 dyn/cm, the printed image may repell.

The protective layer also improves handling characteristics because it covers relatively sticky photopolymerizable layer. It also prevents low molecular materials in the photopolymerizable layer from volatilization when stored, and therefore inhibits reduction of sensitivity and printing durability which are caused by poor curing ability.

It is preferred that the protective layer is soluble or dispersible in water or an alkaline developer, because it is easily formed by coating and can be removed during the developing step. Water soluble polymers are more preferred, because the protective layer is also acted as absorbing layer of ink and further reduces repelling and spreading of ink, thus providing good printed image.

Examples of the preferred protective layers are hydroxymethyl cellulose, hydroxyethyl cellulose, hydroxypropyl cellulose, hydroxypropylmethyl cellulose, a sodium salt of carboxymethyl cellulose, polyethylene oxide, a mixture thereof and the like.

The protective layer is formed on the photopolymerizable layer by a known method. For example, an aqueous solution of the above mentioned water soluble polymers is coated on the photopolymerizable layer and dried. A protective layer is preliminary formed on another substrate and then transferred onto the photopolymerizable layer. Selection of the method can be decided by the material to be used. For example, if the water soluble polymers are celluloses, such as hydroxypropylmethyl cellulose, it may be formed into an aqueous solution which is directly coated on the photopolymerizable layer. It may also be coated on a polyethylene terephthalate film to form a transferable sheet and then the dried cellulose film is transferred onto the photopolymerizable layer.

The protective layer preferably has a thickness of 0.1 to 2 g/m$^2$, more preferably 0.5 to 1 g/m$^2$. Thickness of less than 0.1 g/m$^2$ reduces the technical effects of the protective layer, i.e. prevention of stickiness and prevention of the valatile components in the photopolymerizable layer. Thickness of more than 2 g/m² reduces permeability of oxygen gas, thus reducing storage stability of the photosensitive plate and lowering resolution of the printing plate. Further, the protective layer tends to remain on the photopolymerizable layer after development and arises scumming during printing.

Although the protective layer has oxygen permeability, diffusion of oxygen atoms into the photopolymerizable layer is diminished by the presence of the protective layer. Accordingly, when an ink is ink-jet printed on the protective layer, shielding power of oxygen is enhanced at the portion on which an image is formed. This extends freedom of ink selection. Even when an aqueous ink composition contains a little amount of polymers and does not provide sufficient shielding power of oxygen, the protective layer makes up for the oxygen shielding power and therefore makes it possible to produce a printing plate having good resolution.

The aqueous ink composition can be anyone which is used for ink-jet printing. The aqueous ink composition preferably comprises:

(a) 0.2 to 15% by weight of a water soluble or water dispersible polymer which is capable of transmitting the light to cure the photopolymerizable layer, (b) 0.5 to 40% by weight of a polyhydric alcohol, and (c) 0.1 to 5% by weight of a surfactant.

The polymer (a) employed in the aqueous ink composition is water sobluble or water dispersible and is capable of transmitting the light to cure the photopolymerizable layer. The polymer (a) may be either a synthetic material or natural material, for example polyvinyl alcohol(PVA) or its derivative, polyvinyl ether, hydroxymethyl cellulose, hydroxyethyl cellulose, hydroxypropyl cellulose, a water soluble alkyd resin, polyethylene oxide(PEO), polyvinyl pyrrolidone(PVP), polyacrylic acid or its sodium salt, sodium alginate, pluran, polyamide, maleic acid copolymer, cellophane, polyester, polyethylene, polycarbonate, polystyrene, polypropylene, polyvinyl chloride, polyvinylidene chloride, a mixture thereof and the like. Among these, it is preferred that the polymer (a) has a low oxygen permeability coefficient in the form of film, preferably an oxygen permeability coefficient of $1 \times 10^{-11}$.

Typical polymers are listed with their oxygen permeability coefficients;

| Polymer | Temperature (°C.) | Oxygen Permeability Coefficient (cm³cm/cm²scmHg) |
|---|---|---|
| PVA | 30 | $6.23 \times 10^{-17}$ |
| Cellulose | 30 | $8.94 \times 10^{-14}$ |
| Pluran | 30 | $5.10 \times 10^{-15}$ |
| Celophane | 24 | $8.00 \times 10^{-12}$ |
| Nylon-6 | 30 | $1.50 \times 10^{-13}$ |
| Polyester | 30 | $4.20 \times 10^{-12}$ |
| High density polyethylene | 30 | $1.80 \times 10^{-10}$ |
| Low density polyethylene | 30 | $3.50 \times 10^{-10}$ |
| Polycarbonate | 25 | $1.40 \times 10^{-9}$ |
| Polystyrene | 25 | $1.80 \times 10^{-10}$ |
| Polypropylene | 30 | $2.60 \times 10^{-10}$ |
| Polyvinyl chloride | 30 | $1.20 \times 10^{-11}$ |
| Polyvinylidene chloride | 30 | $2.76 \times 10^{-13}$ |

It is apparent from the above table that suitable polymers having an oxygen permeability coefficient of $1 \times 10^{-11}$ are PVA, cellulose, pluran, cellophane, nylon, polyester, polyvinyl chloride and polyvinylidene chloride. Most preferred is PVA, especially having a saponification number of 80 mol % or more or its derivative because of minimum oxygen permeability coefficient.

An amount of the polymer (a) is not limited but depends on oxygen permeability. In case where the polymer has a low oxygen permeability, the polymer (a) may be contained in the ink composition in a relatively lower amount. In case where, on the other hand, it has a high oxygen permeability, it may be contained in a relatively large amount. If the polymer (a) is a polyvinyl alcohol which has a high degree of hydrolysis, it may be contained in a relatively low amount. Generally, an amount of the polymer (a) is within the range of 0.2 to 15% by weight, preferably 0.5 to 10% by weight based on the total amount of the composition. Amounts of less than 0.2% by weight make barrier properties of oxygen poor, thus being poor resolution. Amounts of more than 15% by weight increase viscosity of ink and may cause agglomeration or drying in the form of film. The viscous ink composition is not suitable for ink jet printing.

The polyhydric alcohol (b) is a volatility preventing agent which inhibits evaporation of water in the ink composition and prevents plugging of ink due to agglomeration of dye. The polyhydric alcohol (b) can be optionally added. Examples of the polyhydric alcohols (b) are diols, such as ethylene glycol, diethylene glycol, triethylene glycol, tetraethylene glycol, propylene glycol, dipropylene glycol and polyethylene glycol; triols, such as glycerol; a mixture thereof and the like. The polyhydric alcohol (b) may be present in the ink composition in an amount of 0.5 to 40% by weight, preferably 1.0 to 20% by weight. Amounts of less than 0.5% by weight do not provide sufficient volatility-preventing properties and those of more than 40% by weight may dissolve the photopolymerizable layer by the ink composition and do not provide good printing image.

The ink composition may contain a surfactant not only for preventing repelling and spreading on the protective layer but also for controlling surface tension of the ink composition to adjust an ink drop diameter. The surfactant also has a function of dissolving the polyhydric alcohol, thus preventing dissolution of the photopolymerizable layer by the ink composition. The surfactant is not limited and can be nonionic, cationic and anionic. Typical examples of the surfactants are polyethyleneglycol alkyl ether, such as polyethyleneglycol lauryl ether and polyethyleneglycol nonylphenyl ether; an aliphatic acid diethanol amide, a sodium alkylnaphthalenesulfonate; polyethyleneglycol nonylphenyl ether sulfate; polyethyleneglycol laurylether sulfate triethanol amine; a phosphate of a alkyl phenyl ether or polyethyleneglycol alkyl ether; a mixture thereof and the like.

In case where an ink jet printing process is a continuous jet type, it is preferred that the surfactant is nonionic because the ink composition is electrostatically charged at the tip point of an ink jet nozzle and the charged ink drop changes its direction within an electric field.

An amount of the surfactant in the ink composition is not limited but preferably 0.1 to 5.0% by weight, more preferably 0.2 to 3.0% by weight because, even if it is contained in a large amount, its surface tension is kept almost constant.

The ink composition may contain other components, such as a colorant, a dye, an antibiotic, a stainproofing agent, a mildewcide, a buffer solution, a solubilizing agent and the like. A defoaming agent or a foam inhibiting agent may also be present.

Accoording to the process for producing a lithographic printing plate of the present invention, the aqueous ink composition is ink-jetted based on digital informations stored in for example a computer or a facsimile machine on a photosensitive plate having the protective layer of the present invention. This printing forms an oxygen barrier film derived from the ink composition based on the digital informations to prevent oxygen atoms from invading into the photopolymerizable layer.

The ink-jet printed photosensitive plate is then exposed to light. In the exposing process, the portion on which a printed image is formed from the ink composition is cured upon light irradiation because the invasion of oxygen atoms which has a function of inhibiting polymerization reaction is controlled. On the other hand, the other portion on which no printed image is present is not cured upon light irradiation because the invasion of oxygen atoms freely occurs so that polymerization reaction is effectively inhibited. Then, the exposed plate is developed with a developer to remove the uncured portion, i.e. the portion on which no printed image is present to obtain a lithographic printing plate.

The following Examples and Comparative Examples further illustrate the present invention in detail but are not to be construed to limit the scope thereof. In the Examples and Comparative Examples, all "parts" are by weight unless otherwise stated.

EXAMPLES 1 TO 12 AND COMPARATIVE EXAMPLES 1 TO 13

In these Examples and Comparative Examples, a relation between a water-soluble polymer in an aqueous ink composition as well as a kind of the water-soluble polymer in a surface protective layer and image quality (resolution) will be explained.

First of all, an aluminum substrate was roughened by mechanical polishing and electropolishing and subjected to an anodizing treatment and a sodium silicate treatment. A photopolymerizable composition of the following formulation was then applied on the aluminum substrate. Thereafter, the surface of a photosensitive layer was covered with a protective layer containing a polymer shown in Table I (Component B) to form a photosensitive plate.

| Formulation of photopolymerizable composition | |
|---|---|
| Ingredient | Amount (parts) |
| Acrylic resin (Mw: 200,000; AV: 19) | 21.12 |
| St-MA half ester (Mw: 20,000; AV: 185) | 11.80 |
| Urethane oligomer | 21.12 |
| Pentaerythritol triacrylate | 37.27 |
| Polymerization inhibitor | 1.24 |
| Photopolymerization initiator (IR#907) | 6.21 |
| Colorant (Victoria Pure Blue) | 1.24 |
| Ethanol | 60.87 |
| Methyl ethyl ketone | 467.70 |
| Total | 628.58 |

Acrylic resin: B723 (trade Same), manufactured by Polyvinyl Chemical Co.

St-MA half ester: Scripset 540 (trade name), manufactured by Monsanto Co.

Urethane oligomer: Viscoat (trade name), manufactured by Osaka Yuki Kagaku Kogyo K.K.

Polymerization Inhibitor: 2,6-Di-t-butyl-4-methylphenol

Photopolymerization Initiator: IR#907 (trade name), manufactured by Ciba-Geigy Co.

Then, by using an ink-jet printer HG-800 (manufactured by Epson K.K.), the resulted resin plate was printed with an aqueous ink composition of the following formulation, followed by exposure with a medal halide lamp (power output: 3 kW) and further development with a commercially available developer.

| Formulation of aqueous ink composition | |
|---|---|
| Ingredients | Amount (parts) |
| Water-soluble or water-dispersed polymer (Component A) | 3.00 |
| Dye (Malachite Green) | 0.05 |
| Glycerol | 20 |
| Deionized water | 75 |
| Polyethyleneglycol nonylphenyl ether | 2.00 |
| Total | 100.05 |

Image quality of a printing plate obtained by using in combination of various water-soluble polymers shown in Table I (Components A and B) was evaluated. The results are shown in Table I.

TABLE I

| | Component A | Compoment B | Ink-jet Printing quality | Remaining minimum dot diameter (μ) | Remaining minimum line width (μ) | Image quality of the plate | Printing durability |
|---|---|---|---|---|---|---|---|
| Ex. 1 | KL-05 | HEC | Good | 101.0 | 127.2 | Good | 30,000 |
| Ex. 2 | KL-05 | HPC | Good | 109.7 | 132.4 | Good | 30,000 |
| Ex. 3 | KL-05 | HPMC | Good | 104.6 | 120.7 | Good | 30,000 |
| Ex. 4 | KL-05 | PEO | Good | 105.2 | 124.9 | Good | 30,000 |
| Ex. 5 | GL-05 | HEC | Good | 86.4 | 85.2 | Good | ≧50,000 |
| Ex. 6 | GL-05 | HPC | Good | 87.5 | 86.0 | Good | ≧50,000 |
| Ex. 7 | GL-05 | HPMC | Good | 87.0 | 89.8 | Good | ≧50,000 |
| Ex. 8 | GL-05 | PEO | Good | 87.2 | 88.3 | Good | ≧50,000 |
| Ex. 9 | AL-06 | HEC | Good | 87.6 | 88.5 | Good | ≧50,000 |
| Ex. 10 | AL-06 | HPC | Good | 88.7 | 87.5 | Good | ≧50,000 |
| Ex. 11 | AL-06 | HPMC | Good | 86.7 | 89.7 | Good | ≧50,000 |
| Ex. 12 | AL-06 | PEO | Good | 87.1 | 87.9 | Good | ≧50,000 |

Component A: Water-soluble polymer in an aqueous ink composition (content: 3.0%)

Component B: Water-soluble polymer in a protective layer provided on the surface of a polymerizable layer (film thickness: 0.5 g/m2)

NK-05: Polyvinyl alcohol, Gosenol, manufactured by Nippon Gosei Kagaku Kogyo K.K. (saponification number: 74 mol %; polymerization degree: 500)

KL-05: Polyvinyl alcohol, Gosenol, manufactured by Nippon Gosei Kagaku Kogyo K.K. (degree of hydrolysis: 80 mol %; polymerization degree: 500)

GL-05: Polyvinyl alcohol, Gosenol, manufactured by Nippon Gosei Kagaku Kogyo K.K. (degree of hydrolysis: 88 mol %; polymerization degree: 500)

AL-06: Polyvinyl alcohol, Gosenol, manufactured by Nippon Gosei Kagaku Kogyo K.K. (degree of hydrolysis: 98 mol %; polymerization degree: 500)

HEC: Hydroxyethyl cellulose, AL15, manufactured by Fuji Chemical K.K. (polymerization degree: 170)

HPC: Hydroxypropyl cellulose, L-G, manufactured by Shinetsu Kagaku Kogyo K.K.

HPMC: Hydroxypropylmethyl cellulose, 65SH400, manufactured by Shinetsu Kagaku Kogyo K.K.

PVP: Polyvinyl pyrrolidone, reagent K-30, manufactured by Wako Junyaku Kogyo K.K.

PEO: Polyethylene oxide, PEO-1, manufactured by Seitetsu Kagaku Kogyo K.K.

Pluran: PI-20, manufactured by Hayashibara K.K.

Sodium alginate: manufactured by Kibun Food Chemifa K.K.

alcohol of which the degree of hydrolysis is more than 80% (alternatively expressed, the saponification number is more than 80 mol %) as the polymer contained in the aqueous ink composition, a printing plate having excellent resolution and printing durability was obtained.

EXAMPLES 13 TO 16 AND COMPARATIVE EXAMPLES 14 AND 15

In these Examples and Comparative Examples, a relation between an amount of a water-soluble polymer in an aqueous ink composition and image quality may be explained.

According to the same manner as that described in Example 1 except that a protective layer of hydroxypropylmethyl cellulose (HPMC) was covered on a photopolymerizable layer in a coating amount of 0.5 g/m2, using an aqueous ink composition of the following formulation wherein various concentration of a water-soluble polymer was contained (the amount X of polyvinyl alcohol is shown in Table il as an amount of GL-05), a lithographic printing plate was obtained.

| Formulation of aqueous ink composition | |
|---|---|
| Ingredient | Amount (parts) |
| Polyvinyl alcohol GL-05 (saponification number 88 mol %; polymerization degree: 500) | X |
| Dye (Malachite Green) | 0.05 |
| Deionized water | 100-X |
| Total | 100.05 |

TABLE I (Continued)

| | Component A | Component B | Ink-jet Printing quality | Remaining minimum dot diameter (μ) | Remaining minimum line width (μ) | Image quality of the plate | Printing durability |
|---|---|---|---|---|---|---|---|
| Comp. 1 | NK-05 | HEC | Good | 140.0 | 178.2 | Poor reproducibility in highlight | 20,000 |
| Comp. 2 | NK-05 | HPC | Good | 134.5 | 169.2 | | 20,000 |
| Comp. 3 | NK-05 | HPMC | Good | 137.2 | 163.5 | | 20,000 |
| Comp. 4 | GL-05 | NK-05 | Good | No image portion is also completely cured. | | — | — |
| Comp. 5 | GL-05 | KL-05 | Good | | | — | — |
| Comp. 6 | GL-05 | GL-05 | Good | | | — | — |
| Comp. 7 | GL-05 | AL-06 | Good | | | — | — |
| Comp. 8 | GL-05 | PVP | Good | Photosensitive layer remains in no image portion | | — | — |
| Comp. 9 | GL-05 | Pluran | Good | | | — | — |
| Comp. 10 | GL-05 | Sodium alginate | Good | | | — | — |
| Comp. 11 | GL-05 | — | Slightly spreading | 113.7 | 134.9 | Poor reproducibility in highlight | 5,000 |
| Comp. 12 | — | HPMC | Good | No image is formed | | — | — |
| Comp. 13 | — | — | spreading | | | — | — |

As is clear from Table I, by using an oxygen-permeable polymer as the protective layer and using a polyvinyl Image quality of the resulted printing plate was evaluated. The results are shown in Table II.

TABLE II

| | GL-05 Content | HPMC thickness (g/m²) | Ink-jet Printing quality | Remaining minimum dot diameter (μ) | Remaining minimum line width (μ) | Image quality of the plate | Printing durability |
|---|---|---|---|---|---|---|---|
| Ex. 13 | 0.5% | 0.5 | Good | 97.5 | 108.2 | Good | ≧50,000 |
| Ex. 14 | 1.0% | 0.5 | Good | 90.0 | 85.7 | Good | ≧50,000 |
| Ex. 15 | 2.0% | 0.5 | Good | 88.0 | 90.0 | Good | ≧50,000 |
| Ex. 16 | 3.0% | 0.5 | Good | 88.0 | 88.0 | Good | ≧50,000 |
| Comp. 14 | — | 0.5 | Good | No image is formed | | — | — |

TABLE II-continued

|  | GL-05 Content | HPMC thickness (g/m²) | Ink-jet Printing quality | Remaining minimum dot diameter (μ) | Remaining minimum line width (μ) | Image quality of the plate | Printing durability |
|---|---|---|---|---|---|---|---|
| Comp. 15 | 0.2% | 0.5 | Good | 135.8 | 172.3 | Poor reproducibility in highlight | 20,000 |

As is clear from Table II, by using a water-soluble polymer contained in an aqueous ink composition in an amount of more than 0.2%, a printing plate having excellent resolution and printing durability was obtained.

EXAMPLES 17 TO 21 AND COMPARATIVE EXAMPLES 16 AND 17

In these Examples and Comparative Examples, a relation between thickness of a protective layer and image quality as well as storage stability of a photosensitive plate will be explained.

According to the same manner as that described in Example 1, a photosensitive plate was obtained with a layer of HPMO having various thickness as a protective layer. The resulted plates having the same film thickness were classified into two groups, and the first group was stored at 40° C. for one month. The second group was not stored. Then, according to the same manner as that described in Example 1 except that an aqueous ink composition of the following formulation was used, a printing plate was obtained using the photosensitive plate of the above first group (after storage) and the second group, respectively.

| Formulation of aqueous ink composition | |
|---|---|
| Ingredient | Amount (parts) |
| Polyvinyl alcohol GL-05 (saponification number 88 mol %, polymerization degree: 500) | 3.00 |
| Dye (Malachite Green) | 0.05 |
| Deionized water | 97 |
| Total | 100.05 |

The resulted plate was evaluated. The results are shown in Table III.

TABLE III

|  | GL-05 Content | HPMC thickness (g/m²) | Ink-jet Printing quality | Remaining minimum dot diameter (μ) | Remaining minimum line width (μ) | Image quality of the plate | Printing durability |
|---|---|---|---|---|---|---|---|
| Ex. 17 | 3.0% | 0.2 | Good | 94.3 | 105.2 | Good | ≧50,000 |
| After storage | 3.0% | 0.2 | Good | 91.7 | 100.8 | Good | ≧50,000 |
| Ex. 18 | 3.0% | 0.5 | Good | 89.9 | 89.7 | Good | ≧50,000 |
| After storage | 3.0% | 0.5 | Good | 88.7 | 85.7 | Good | ≧50,000 |
| Ex. 19 | 3.0% | 1.0 | Good | 86.0 | 88.8 | Good | ≧50,000 |
| After storage | 3.0% | 1.0 | Good | 87.4 | 89.6 | Good | ≧50,000 |
| Ex. 20 | 3.0% | 2.0 | Good | 87.6 | 85.0 | Good | ≧50,000 |
| After storage | 3.0% | 2.0 | Good | 89.2 | 85.9 | Good | ≧50,000 |
| Ex. 21 | 3.0% | 3.0 | Good | Photosensitive layer remains in no image portion | | — | — |
| After storage | 3.0% | 3.0 | Good | | | — | — |
| Comp. 16 | 3.0% | — | Slightly spreading | 118.7 | 138.5 | Poor reproducibility in highlight | 5,000 |
| After storage | 3.0% | — | No image is formed | | | — | — |
| Comp. 17 | 3.0% | 0.1 | Good | 110.8 | 116.9 | Poor reproducibility in highlight | 20,000 |
| After storage | 3.0% | 0.1 | Good | 119.4 | 134.2 | Poor reproducibility in highlight | 20,000 |

As is clear from Table III, change of a resolution and printing durability was small and it showed good storage stability.

According to the present invention, a protective layer is placed on the photopolymerizable layer to ensure a constant relation between the aqueous ink composition and the resulted photosensitive plate. The ink jet printing process can be applied to any kind of photosensitive plates and the photosensitive plate of the present invention makes it possible to print by ink jet printing and produce a lithographic printing plate having good resolution and having no repelling and spreading. This extrends freedom of selection of an ink composition.

What is claimed is:

1. In a process for producing a lithographic printing plate comprising forming a light transmittable oxygen barrier film on a portion of a photopolymerizable layer, which is present on a substrate, then exposing the photopolymerizable layer to light to cure a portion thereof on which the oxygen barrier film is present, and thereafter removing all of the photopolymerizable film not covered with the oxygen barrier film, the improvement wherein a hydroxypropylmethyl cellulose protective layer, which is permeable to oxygen gas and is capable of transmitting the light for curing, is formed on the photopolymerizable layer when forming the lithographic printing plate and the oxygen barrier film is formed thereon by ink-jet printing before development and after forming the protective layer with an aqueous ink composition comprising:

(a) 0.5 to 15% by weight of a polyvinyl alcohol, having a saponification number of 80 mol % or more which is capable of transmitting the light to cure the photopolymerizable layer, (b) 0.5 to 40% by weight of a polyhydric alcohol, and (c) 0.1 to 5% by weight of a surfactant.

2. The process for producing a lithographic printing plate according to claim 1 wherein said photopolymerizable layer is formed from a composition which comprises a polymerizable compound having at least one ethylenically unsaturated group, a photopolymerization initiator end a sensitizer.

3. The process for producing a lithographic printing plate according to claim 1 wherein said photopolymerizable layer has a thickness within the range of 0.1 to 10 $g/m^2$.

4. The process for producing a lithographic printing plate according to claim 3 wherein said protective layer has an oxygen permeability coefficient of $1 \times 10^{-13}$ or more.

5. The process for producing a lithographic printing plate according to claim 3 wherein a surface energy of the protective layer is adjusted within the range of 30 to 60 dyn/cm.

6. The process for producing a lithographic printing plate according to claim 3 wherein said protective layer has a thickness of 0.5 to 2 $g/m^2$.

7. The process according to claim 1 wherein the polyhydric alcohol (b) is selected from the group consisting of ethylene glycol, diethylene glycol, triethylene glycol, tetraethylene glycol, propylene glycol, dipropylene glycol, polyethylene glycol, glycerol and mixtures thereof.

8. The process according to claim 1 wherein said surfactant (c) is selected from the group consisting of polyethyleneglycol lauryl ether, polyethyleneglycol nonylphenyl ether, an aliphatic acid diethanol amide, a sodium alkylnaphthalenesulfonate, polyethyleneglycol nonylphenyl ether sulfate, polyethyleneglycol laurylether sulfate triethanol amine, a phosphate of a alkyl phenyl ether a phosphate of a polyethyleneglycol alkyl ether and mixtures thereof.

* * * * *